(12) United States Patent
Lin

(10) Patent No.: US 6,938,683 B2
(45) Date of Patent: Sep. 6, 2005

(54) RADIATOR

(75) Inventor: Shu-Ju Lin, Taipei (TW)

(73) Assignee: Inventec Corporation, Taipei (TW)

( * ) Notice: Subject to any disclaimer, the term of this patent is extended or adjusted under 35 U.S.C. 154(b) by 74 days.

(21) Appl. No.: 10/752,002

(22) Filed: Jan. 7, 2004

(65) Prior Publication Data

US 2005/0145375 A1 Jul. 7, 2005

(51) Int. Cl.⁷ ............................................... F24H 3/02
(52) U.S. Cl. ...................... 165/121; 454/184; 454/353; 361/695
(58) Field of Search .............................. 165/121, 122; 454/184, 353; 361/695

(56) References Cited

U.S. PATENT DOCUMENTS

| | | | | |
|---|---|---|---|---|
| 6,031,717 A | * | 2/2000 | Baddour et al. | 361/687 |
| 6,042,348 A | * | 3/2000 | Aakalu et al. | 417/423.5 |
| 6,115,250 A | * | 9/2000 | Schmitt | 361/695 |
| 6,135,875 A | * | 10/2000 | French | 454/184 |
| 6,155,920 A | * | 12/2000 | Pan et al. | 454/184 |

* cited by examiner

*Primary Examiner*—Terrell Mckinnon
(74) *Attorney, Agent, or Firm*—Birch, Stewart, Kolasch & Birch, LLP

(57) ABSTRACT

A radiator, adopted on electronic devices with radiator fans installed in series, includes a case, two or more radiator fans and a membrane check valve. The radiator fans are located on the inner wall surface of the case. The membrane check valve has a frame, at least one bracing bracket and membrane petals. The frame is located between the radiator fan and the inner wall surface of the case. The bracing bracket is located in the frame to form a plurality of cells with the frame. The membrane petals' one end attaches to one side of the frame and is more directed towards air outlets of the radiator fans than the bracing bracket. When any radiator fans stops operation, air inside the electronic devices flow outwards in the positive direction to balance the pressure and prevent heat dissipation efficiency of the electronic devices from dropping excessively.

2 Claims, 6 Drawing Sheets

RADIATOR

FIELD OF THE INVENTION

The invention relates to a radiator adopted for use on electronic devices that have radiator fans installed in series and particularly to a radiator that allows air inside an electronic device to flow outwards in the positive direction to balance the pressure without excessively reducing heat dissipation efficiency when any of the radiator fans stops operation.

BACKGROUND OF THE INVENTION

Nowadays electronic devices have almost become necessary goods in people's life. When the electronic device is in use, heat energy is generated. Hence the electronic device usually has radiator fans. The radiator fan has rotary vanes to discharge heated air and maintain the electronic device at a desired temperature for normal operation. For more delicate electronic devices, a great amount of heat energy is generated. Hence increasing heat dissipation efficiency of the electronic device is important.

Referring to FIG. 1 for a chart showing the relationship between pressure and airflow. During tests, the radiator fan is located in a housing tank. The housing tank has an opening. When the opening is completely blocked, a maximum pressure difference (minimum airflow) at two ends of the radiator fan is obtained. On the contrary, when the opening is fully open, a minimum pressure difference (maximum airflow) at two ends of the radiator fan is obtained. The curves in FIG. 1 indicate the maximum pressure overcome by the radiator fan. The cross points of the curves and the pressure axis are the maximum pressure differences, while the cross points of the curves and the airflow axis are the minimum pressure differences. The areas covered by the curves and two axes are the discharged airflow of the radiator fan. For an electronic device which has two radiator fans installed in series, a best heat dissipation efficiency may be obtained as shown by curve A. When the electronic device has only one radiator fan, it has a second best heat dissipation efficiency as shown by curve B. When the electronic device has two radiator fans installed in series, and the radiator fan close to the interior of the electronic device stops operation, it has a second worst heat dissipation efficiency as shown by curve C. When the electronic device has two radiator fans installed in series, and the radiator fan close to the exterior of the electronic device stops operation, it has the worst heat dissipation efficiency as shown by curve D.

In most circumstances, electronic devices have two radiator fans installed in series to improve heat dissipation efficiency. However, if any one of the radiator fans stops operation, the resulting heat dissipation efficiency is lower than only one radiator fan is installed. This is because air inside the electronic device cannot flow outwards in the positive direction. The pressure difference between the interior and exterior increases, and heat dissipation efficiency drops. To remedy this drawback, there is a design to increase the rotation speed of one radiator fan when another radiator fan has stopped operation so that the heat dissipation efficiency of the radiator with two series radiator fans (curve A) is close to the heat dissipation efficiency of the radiator with one radiator fan stopping operation (curve C or D). Namely, the difference of heat dissipation efficiency is not excessively large when the two radiator fans are operating and when any of the radiator fans is not operable. Of course, to make the curve A close to the curves C and D also is the direction the industry is pursuing.

SUMMARY OF THE INVENTION

The primary object of the invention is to provide a radiator adopted for use on electronic devices that have radiator fans installed in series and allows air inside the electronic device to flow outwards in the positive direction in case any of the radiator fans stops operation. Thereby, to balance pressure and prevent the heat dissipation efficiency of the electronic device from dropping excessively.

The radiator according to the invention includes a case, radiator fans installed in series and a membrane check valve. The membrane check valve includes a frame, a bracing bracket and membrane petals. The bracing bracket is located in the frame to form a plurality of cells with the frame. The membrane petals have one end attached to one side of the frame. When air flows in the positive direction through the cells to the membrane petals, the membrane petals move away from the bracing bracket. When the air flows in the reverse direction to the membrane petals, the membrane petals attach to the bracing bracket. Thus when the radiator of the invention is adopted on an electronic device, air inside the electronic device can flow outwards in the positive direction when any of the radiator fans stops operation. Thereby, the pressure may be balanced and heat dissipation efficiency may be prevented from dropping excessively.

Through installing the membrane check valve between the radiator fan and the inner wall surface of the case, and completely covering the surrounding of the radiator fans, and with the membrane petals being more directed towards air outlets of the radiator fans than the bracing bracket, air inside the electronic device can flow outwards in the positive direction when any of the radiator fans stops operation. Thereby, pressure may be balanced and heat dissipation efficiency of the electronic device may be prevented from dropping excessively. Of course the membrane check valve does not have to cover the surrounding of the radiator fan completely to achieve the same result.

By means of the construction set forth above, when the electronic device has two or more radiator fans installed in series and any one of the radiator fans stops operation, the membrane check valve of the invention can prevent heat dissipation efficiency of the electronic device from dropping excessively.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
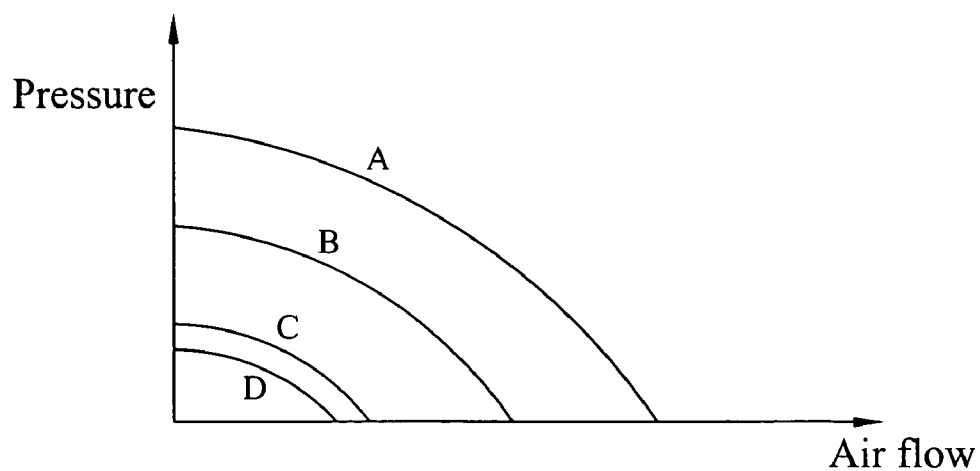
FIG. 1 is a chart showing the relationship of pressure and airflow.
Figure 2:
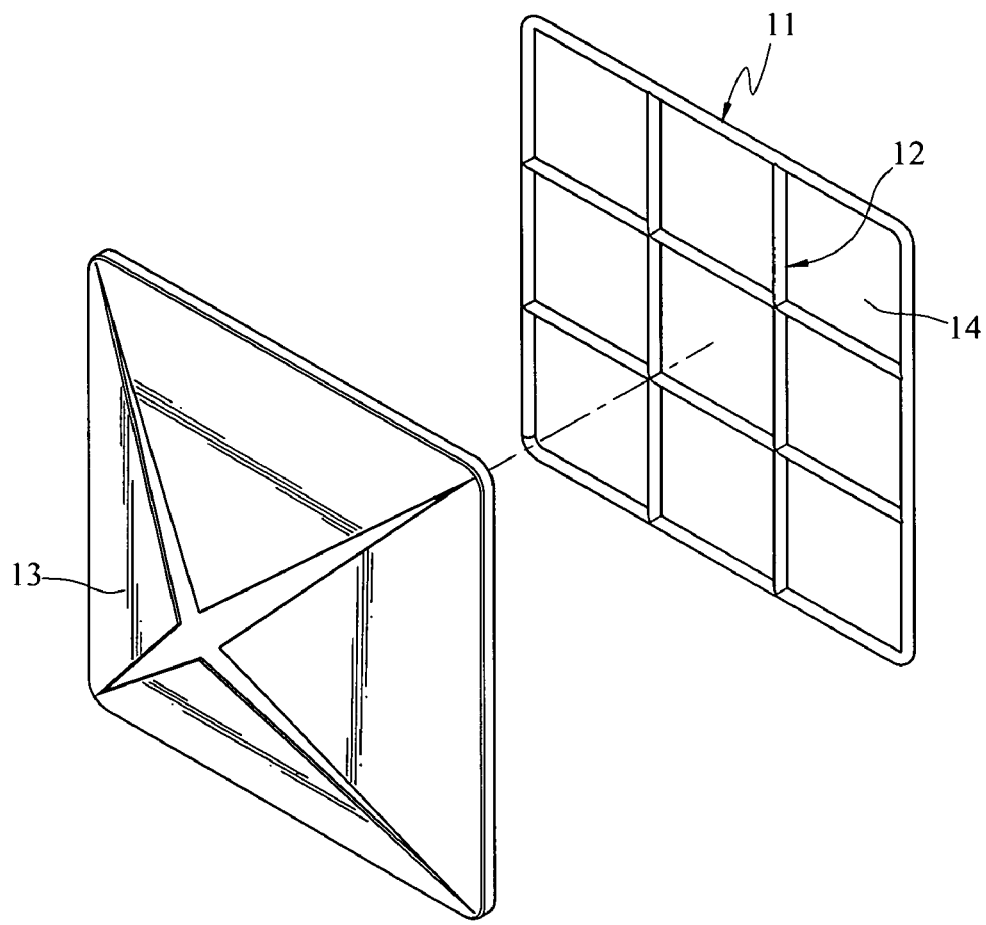
FIG. 2 is an exploded view of the membrane check valve according to the invention.
Figure 3:
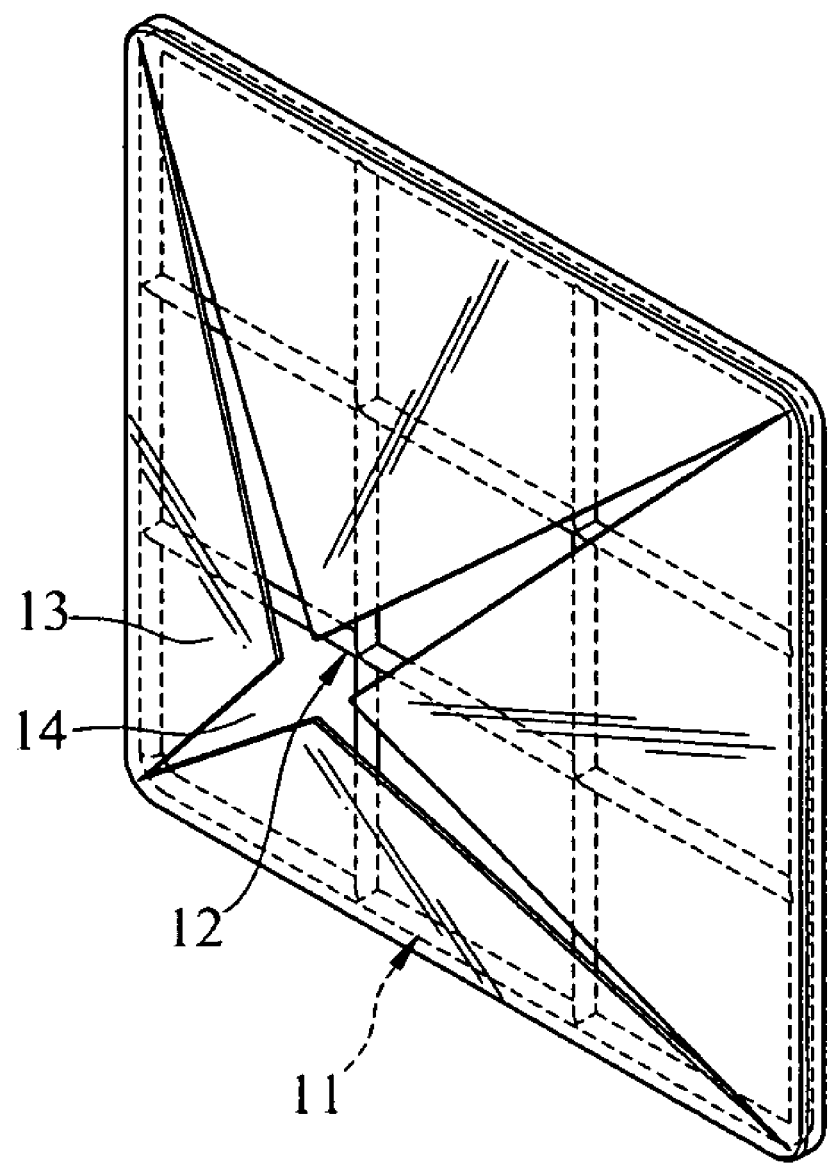
FIG. 3 is a perspective view of the membrane check valve according to the invention.
Figure 4A:
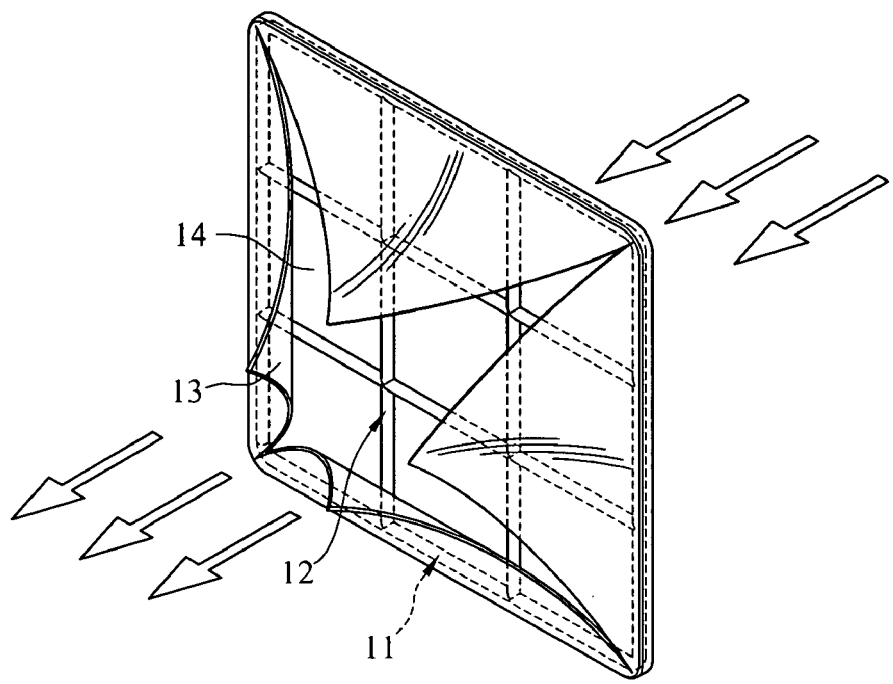
FIGS. 4A and 4B are schematic views of the membrane check valve in operations under different airflow directions.
Figure 4B:
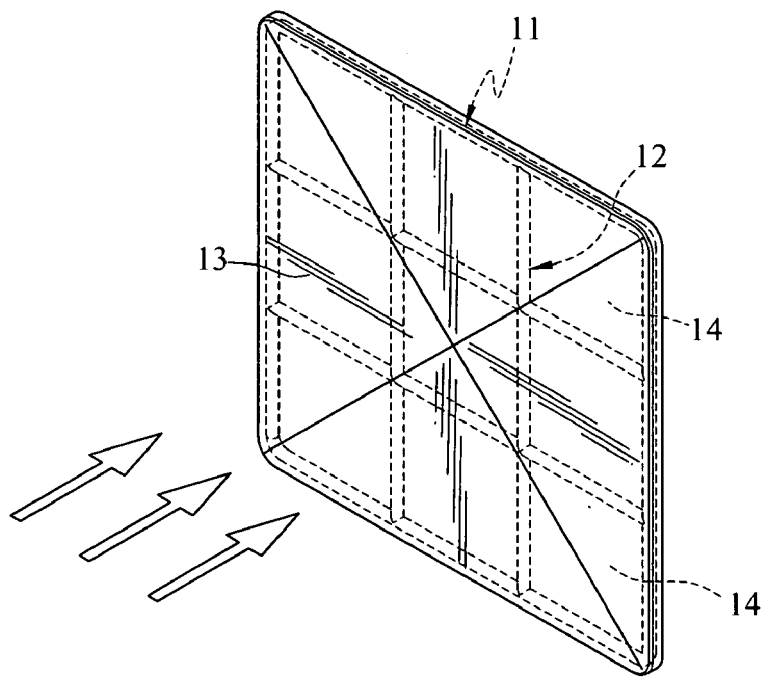
Figure 6A:
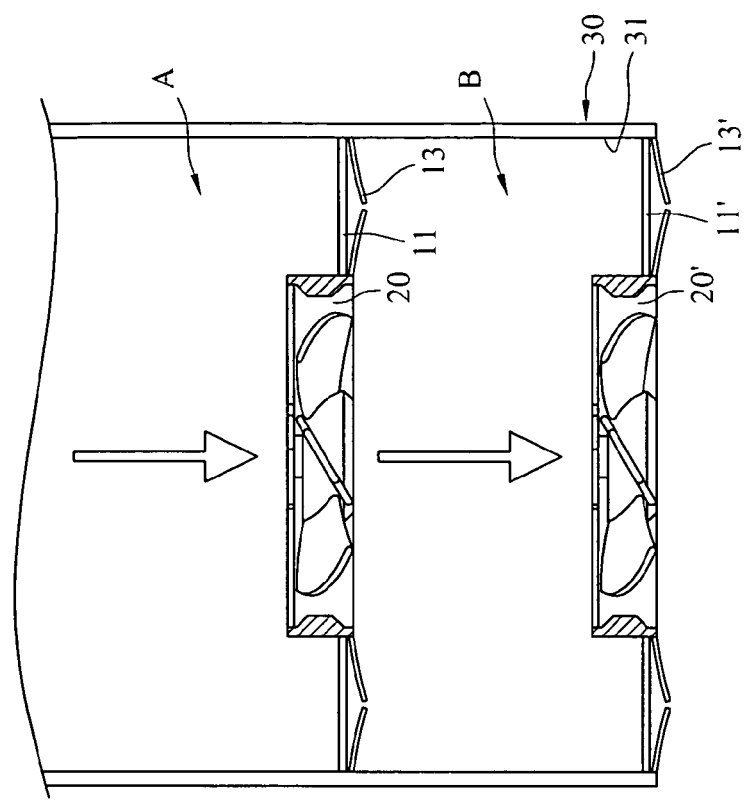
FIGS. 6A, 6B and 6C are sectional views of the invention.
Figure 5:
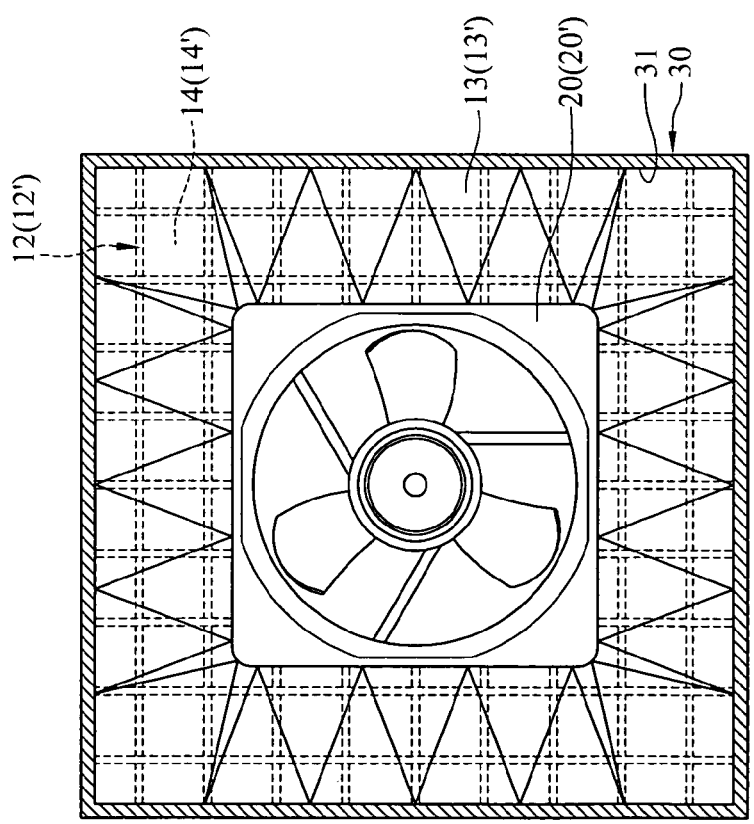
FIG. 5 is a sectional view of the invention.
Figure 6C:
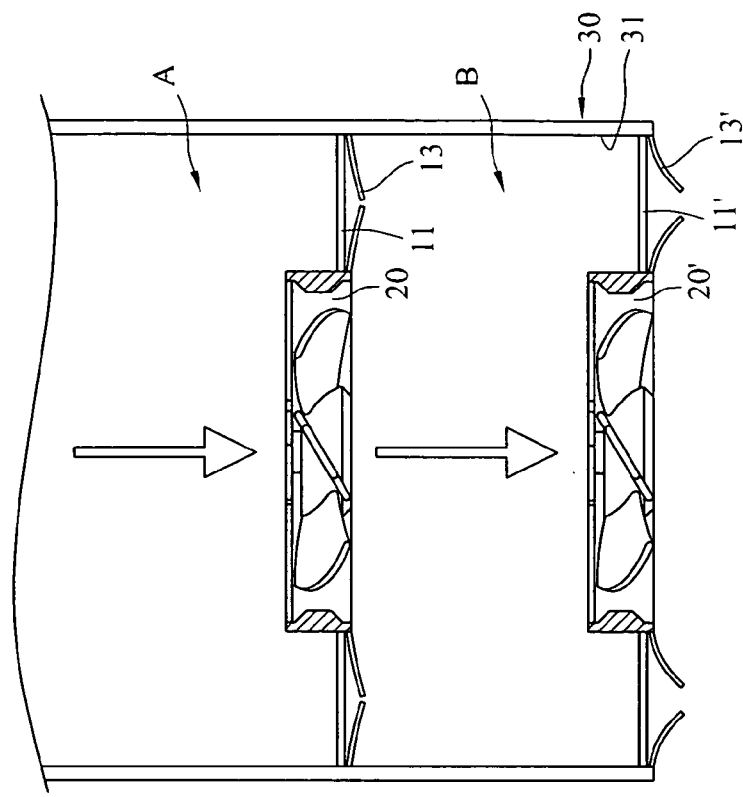
Figure 6B:
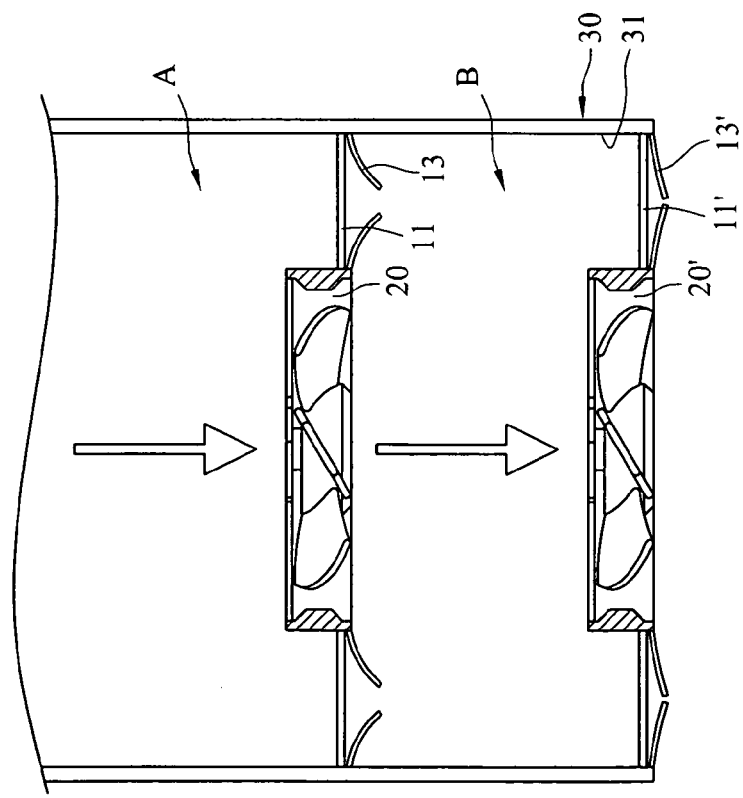

Referring to FIGS. 5 through 6C, the radiator according to the invention includes a case 30, radiator fans 20 and 20' arranged in series and a membrane check valve. Also referring to FIGS. 2 through 4B, the membrane check valve includes a frame 11 (11'), a bracing bracket 12 (12') and membrane petals 13 (13'). The bracing bracket 12 (12') is located in the frame 11 (11') to form a plurality of cells 14 (14'). The membrane petals 13 (13') have one end attaching to one side of the frame 11 (11'). When air flows in the positive direction through the cells 14 (14') to the membrane petals 13 (13'), the membrane petals 13 (13') move away from the bracing bracket 12 (12'). When the air flows in the reverse direction towards the membrane petals 13 (13'), the membrane petals 13 (13') attach to the bracing bracket 12 (12'). Thus when the radiator of the invention is adopted on an electronic device with the radiator fans 20 and 20' installed in series (referring to FIGS. 6A, 6B and 6C), and in the event that any of the radiator fans 20 (20') stops operation, air inside the electronic device can flow outwards in the positive direction, thereby balancing the pressure and preventing heat dissipation efficiency of the electronic device from dropping excessively.

Referring to FIGS. 5 through 6C, the frame 11 (11') is installed between the radiator fan 20 (20') and the inner wall surface of the case 30, and completely covers the surrounding of the radiator fan 20 (20'). Of course the bracing bracket 12 (12') and the membrane petals 13 (13') also are located thereon. The membrane petals 13 (13') are more directed towards the air outlet of the radiator fan 20 (20') than the bracing bracket 12 (12'). The radiator fans 20 and 20' divide the space inside the case 30 that borders the radiator fan 20 into zone A, the space between the radiator fans 20 and 20 into zone B, and the space outside the case 30 that borders the radiator fan 20' into zone C.

Referring to FIG. 6A, when the radiator fans 20 and 20' operate normally, air flows from zone A through the radiator fan 20, zone B, radiator fan 20' and reaches zone C. Namely, air flows in the positive direction from the air inlets of the radiator fans 20 and 20' to the air outlets. While the air is flowing, the radiator fans 20 and 20' that operate normally, carry most air in the positive direction as mentioned above, while a portion of air flows through the cells 14 to the membrane petals 13, and the membrane petals 13 are moved away slightly from the bracing bracket 12. Thus air flows in the positive direction from the air inlets through the radiator fans 20, 20', cells 14 and membrane petals 13 to the air outlets.

Referring to FIG. 6B, in the event that the radiator fan 20 stops operation, only a portion of the air may flow through. Namely most of the air originally carried by the radiator fan 20 no longer is carried away from zone A, hence the instantaneous pressure between zone A and zone B increases. The membrane petals 13 are forced to move away from the bracing bracket 12 to enable most of the air to flow in the positive direction from the air inlets, and pass through the membrane petals 13 to the air outlets. While a portion of the air flows through the radiator fan 20 to release the pressure of zone A and reduce the pressure difference between zone A and zone B, heat dissipation efficiency of the electronic device can be prevented from dropping excessively.

Referring to FIG. 6C, when the radiator fan 20' stops operation, only a portion of air may pass through. Namely most of the air previously carried by the radiator fan 20' not longer is carried away from zone B, hence the instantaneous pressure between zone B and zone C increases. The membrane petals 13' are forced to move away from the bracing bracket 12' to enable most of the air to flow in the positive direction from the air inlets, and pass through the membrane petals 13' to the air outlets. While a portion of the air flows through the radiator fan 20' to release the pressure of zone B and reduce the pressure difference between zone B and zone C, heat dissipation efficiency of the electronic device can be prevented from dropping excessively.

Figure 7:
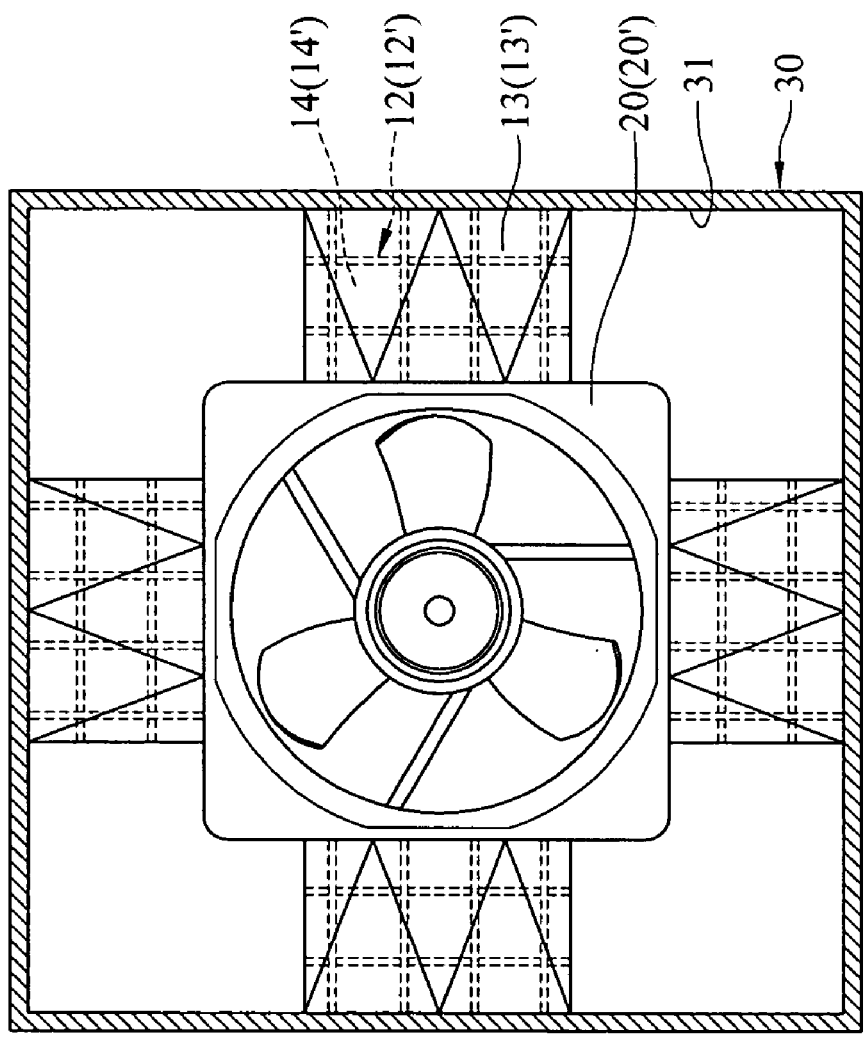
FIG. 7 is a sectional view of another embodiment of the invention.

Refer to FIG. 7 for another embodiment of the invention. The frame 11 (11') does not completely cover the surrounding of the radiator fans 20 and 20'. Therefore, when any of the radiators fans 20 and 20' stops operation, air can flow in the positive direction from the air inlets through the membrane petals 13 (13') to the air outlets to reduce the pressure difference and prevent the heat dissipation efficiency of the electronic device from dropping excessively.

By means of the construction set forth above, adopting the invention on electronic devices that have two or more radiator fans 20 and 20' installed in series, in the event of any of the radiator fans 20 and 20' stops operation, heat dissipation efficiency of the electronic devices can be prevented from dropping excessively.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A radiator for an electric device, comprising:
   a case;
   at least two radiator fans located respectively on an inner wall surface of the case in series; and
   a membrane check valve including:
      a frame located between the radiator fan and the inner wall surface of the case;
      at least one bracing bracket located in the frame to form a plurality of cells with the frame; and
      a membrane petal attached to one side of the frame being more directed towards air outlets of the radiator fans than the bracing bracket.

2. The radiator of claim 1, wherein the frame covers the entire surrounding of the radiator fans.

* * * * *